United States Patent
Wu

(10) Patent No.: US 10,825,765 B2
(45) Date of Patent: Nov. 3, 2020

(54) SEMICONDUCTOR STRUCTURE AND MANUFACTURING METHOD THEREOF

(71) Applicant: TAIWAN SEMICONDUCTOR MANUFACTURING COMPANY LTD., Hsinchu (TW)

(72) Inventor: Tung-Jiun Wu, Hsinchu County (TW)

(73) Assignee: TAIWAN SEMICONDUCTOR MANUFACTURING COMPANY LTD., Hsinchu (TW)

( * ) Notice: Subject to any disclaimer, the term of this patent is extended or adjusted under 35 U.S.C. 154(b) by 0 days.

(21) Appl. No.: 16/046,657

(22) Filed: Jul. 26, 2018

(65) Prior Publication Data
US 2020/0035595 A1 Jan. 30, 2020

(51) Int. Cl.
*H01L 23/00* (2006.01)
*H01L 23/522* (2006.01)
*H01L 49/02* (2006.01)

(52) U.S. Cl.
CPC .......... *H01L 23/5223* (2013.01); *H01L 24/05* (2013.01); *H01L 24/13* (2013.01); *H01L 28/40* (2013.01); *H01L 2224/0401* (2013.01); *H01L 2224/05025* (2013.01); *H01L 2224/05124* (2013.01); *H01L 2224/05139* (2013.01); *H01L 2224/05144* (2013.01); *H01L 2224/05147* (2013.01); *H01L 2224/05155* (2013.01); *H01L 2224/05164* (2013.01); *H01L 2224/05184* (2013.01); *H01L 2224/13026* (2013.01); *H01L 2224/13144* (2013.01); *H01L 2224/13147* (2013.01); *H01L 2224/13155* (2013.01); *H01L 2924/19041* (2013.01); *H01L 2924/19104* (2013.01)

(58) Field of Classification Search
None
See application file for complete search history.

(56) References Cited

U.S. PATENT DOCUMENTS

| 2007/0001306 A1* | 1/2007 | Su | H01L 21/76808 |
| | | | 257/758 |
| 2012/0181657 A1* | 7/2012 | Wu | H01L 23/5223 |
| | | | 257/532 |

* cited by examiner

*Primary Examiner* — Reema Patel
(74) *Attorney, Agent, or Firm* — WPAT, P.C., Intellectual Property Attorneys; Anthony King

(57) ABSTRACT

A semiconductor structure includes a substrate; a first dielectric layer disposed over the substrate; a conductive member surrounded by the first dielectric layer; a second dielectric layer disposed over the substrate, the first dielectric layer and the conductive member; a capacitor disposed over the conductive member and the second dielectric layer; a third dielectric layer disposed over the second dielectric layer and the capacitor; a conductive via disposed over and contacted with the conductive member, and extended through the second dielectric layer, the capacitor and the third dielectric layer; a conductive pad disposed over and contacted with the conductive via; a fourth dielectric layer disposed over the third dielectric layer and surrounding the conductive pad; and a conductive bump disposed over and electrically connected to the conductive pad, wherein the third dielectric layer includes an oxide layer and a nitride layer.

20 Claims, 15 Drawing Sheets

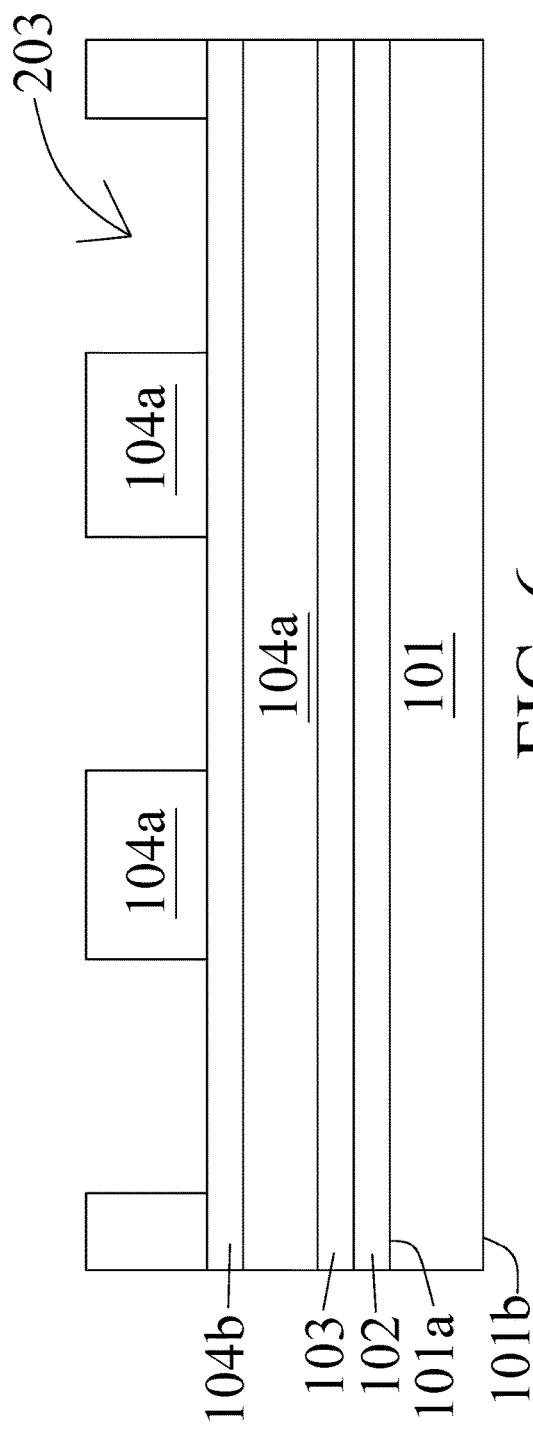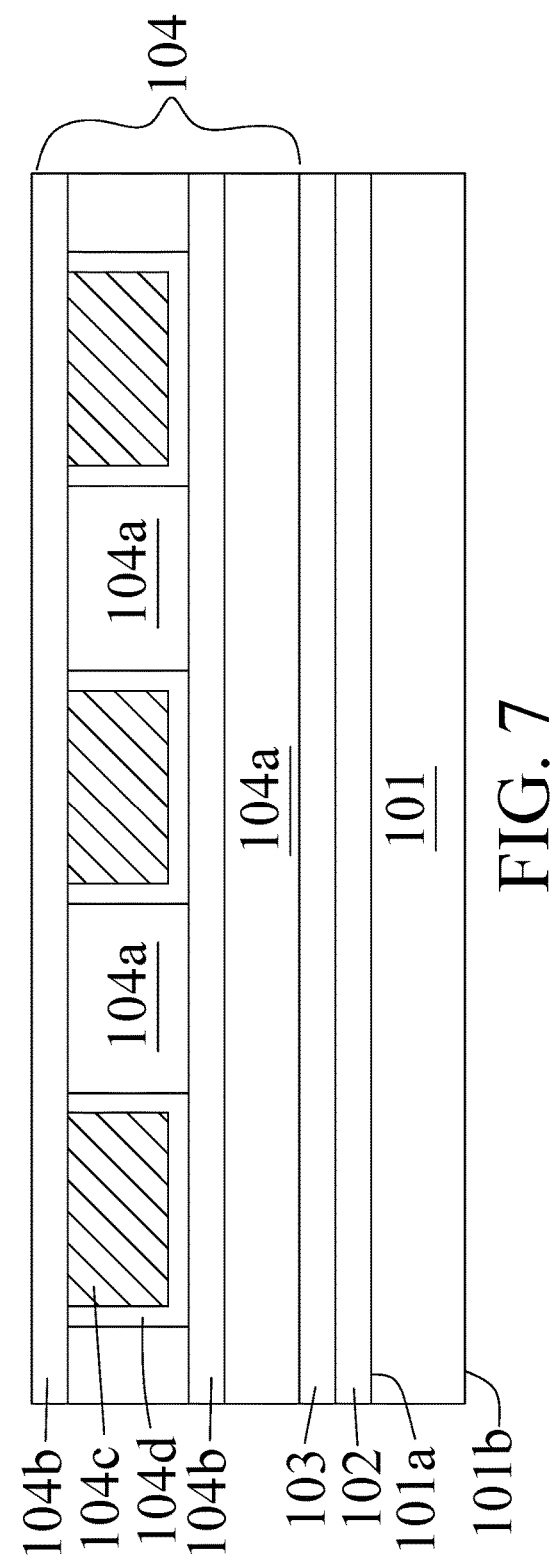

SEMICONDUCTOR STRUCTURE AND MANUFACTURING METHOD THEREOF

BACKGROUND

Electronic equipments using semiconductor devices are essential for many modern applications. With the advancement of electronic technology, the semiconductor devices are becoming increasingly smaller in size while having greater functionality and greater amounts of integrated circuitry. Due to the miniaturized scale of the semiconductor device, a number of semiconductor components are assembled on the semiconductor device. Furthermore, numerous manufacturing operations are implemented within such a small semiconductor device.

However, the manufacturing operations of the semiconductor device involve many steps and operations on such a small and thin semiconductor device. The manufacturing of the semiconductor device in a miniaturized scale becomes more complicated. An increase in a complexity of manufacturing the semiconductor device may cause deficiencies such as poor electrical interconnection, delamination of components or other issues, resulting in a high yield loss of the semiconductor device. The semiconductor device is produced in an undesired configuration, which would further exacerbate materials wastage and thus increase the manufacturing cost.

Since more different components with different materials are involved, a complexity of the manufacturing operations of the semiconductor device is increased. As such, there is a continuous need to modify a structure of the semiconductor devices and improve the manufacturing operations of the semiconductor devices.

BRIEF DESCRIPTION OF THE DRAWINGS

Aspects of the present disclosure are best understood from the following detailed description when read with the accompanying figures. It is emphasized that, in accordance with the standard practice in the industry, various features are not drawn to scale. In fact, the dimensions of the various features may be arbitrarily increased or reduced for clarity of discussion.

FIGS. 4-17 are schematic views of manufacturing a semiconductor structure by a method of FIG. 3 in accordance with some embodiments of the present disclosure.

DETAILED DESCRIPTION OF THE DISCLOSURE

Figure 1:
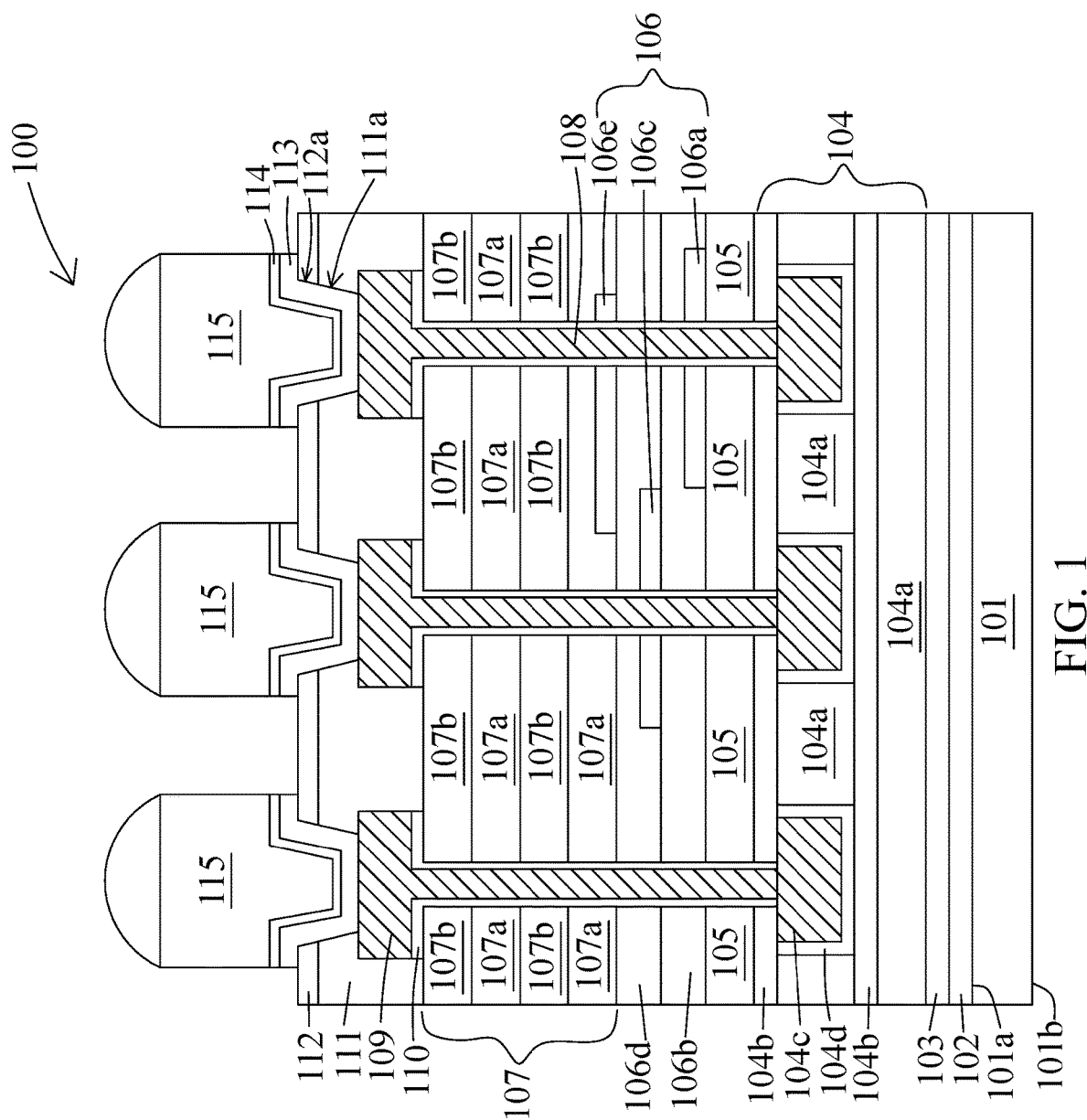
FIG. 1 is a schematic cross sectional view of a semiconductor structure in accordance with some embodiments of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Metal-insulator-metal (MIM) capacitor is involved in a semiconductor structure. The MIM capacitor is disposed horizontally over a substrate or wafer. A dielectric material such as plasma enhanced oxide (PEOX), undoped silicate glass (USG), etc. is disposed over the MIM capacitor. An interconnect structure is formed to connect the MIM capacitor with a conductive bump disposed over the dielectric material and the MIM capacitor. The conductive bump is then attached to and mounted over another semiconductor structure such as a package, circuit board, etc., such that a circuitry of the semiconductor structure is connected to a circuitry of another semiconductor structure.

However, such mounting of the conductive bump over another semiconductor structure would cause stress on the dielectric material, the MIM capacitor or other components of the semiconductor structure. As such, cracks would be developed in the dielectric material, the MIM capacitor or other components, and would be delaminated easily. Strength of the semiconductor structure is decreased, and circuitry in the semiconductor structure would be damaged. Ultimately, reliability and performance of the semiconductor structure would be adversely affected.

In the present disclosure, a semiconductor structure and a manufacturing thereof is disclosed. The semiconductor structure includes a substrate, a capacitor disposed over the substrate, a dielectric layer over the capacitor, a conductive via disposed over the substrate and extended through the capacitor and the dielectric layer, and a conductive bump disposed over and electrically connected with the conductive via. The dielectric layer includes an oxide layer and a nitride layer. The oxide layer and the nitride layer are alternately disposed. Since the dielectric layer includes the nitride layer, a strength of the dielectric layer is increased to resist stress. As such, development of cracks and delamination of components of the semiconductor structure would be decreased or prevented.

FIG. 1 is a schematic cross sectional view of a semiconductor structure 100 in accordance with various embodiments of the present disclosure. In some embodiments, the semiconductor structure 100 includes a substrate 101, an interlayer dielectric (ILD) 102, an intermetal dielectric (IMD) 104, a conductive member 104c, a capacitor 106, a dielectric layer 107, a conductive via 108, a conductive pad 109, a bump pad 113 and a conductive bump 115. In some embodiments, the semiconductor structure 100 is a part of a die or a package. In some embodiments, the semiconductor structure 100 is configured to connect with another semiconductor structure such as a printed circuit board (PCB).

In some embodiments, the substrate 101 includes semiconductive materials such as silicon or other suitable materials. In some embodiments, the substrate 101 is a silicon substrate or silicon wafer. In some embodiments, the substrate 101 includes a first surface 101a and a second surface 101b opposite to the first surface 101a. In some embodiments, the first surface 101a of the substrate 101 is a front side of the substrate 101. In some embodiments, the second surface 101b is a back side of the substrate 101.

In some embodiments, the ILD 102 is disposed over the substrate 101. In some embodiments, the ILD 102 is disposed over the first surface 101a of the substrate 101. In some embodiments, the ILD 102 includes dielectric material such as silicon oxide, borophosphosilicate glass (BPSG), phosphosilicate glass (PSG) or the like. In some embodiments, a gate structure is disposed in the ILD 102. In some embodiments, several semiconductor devices such as transistors or the like are disposed in the ILD 102. In some embodiments, a first barrier layer 103 is disposed over the ILD 102. In some embodiments, the first barrier layer 103 includes silicon carbide (SiC) or the like.

In some embodiments, the IMD 104 is disposed over the ILD 102. In some embodiments, the IMD 104 includes several dielectric layers and several conductive members in the dielectric layers. In some embodiments, the IMD 104 includes a first dielectric layer 104a and a conductive member 104c.

In some embodiments, the first dielectric layer 104a is disposed over the substrate 101. In some embodiments, the first dielectric layer 104a is disposed over the first surface 101a of the substrate 101. In some embodiments, the first dielectric layer 104a is disposed over or contacted with the first barrier layer 103. In some embodiments, the ILD 102 is disposed between the substrate 101 and the first dielectric layer 104a. In some embodiments, the first dielectric layer 104a includes undoped silicate glass (USG), fluorinated silicate glass (FSG) or the like.

In some embodiments, the first dielectric layer 104a is arranged in several layers. In some embodiments, a second barrier layer 104b is sandwiched between the layers of the first dielectric layer 104a. In some embodiments, the second barrier layer 104b is contacted with the first dielectric layer 104a. In some embodiments, the second barrier layer 104b is arranged in several layers. In some embodiments, the layers of the second barrier layer 104b and the layers of the first dielectric layer 104a are alternately disposed. In some embodiments, the second barrier layer 104b includes silicon nitride (SiN) or the like.

In some embodiments, the conductive member 104c is surrounded by the first dielectric layer 104a. In some embodiments, the conductive member 104c is disposed over the substrate 101, the ILD 102, the first barrier layer 103 and the second barrier layer 104b. In some embodiments, the conductive member 104c includes copper, gold, silver, aluminum or the like. In some embodiments, the conductive member 104c is a top metal of the IMD 104. In some embodiments, a semiconductor device in the ILD 102 is electrically connected to the conductive member 104c. In some embodiments, the second barrier layer 104b is disposed over the conductive member 104c. In some embodiments, the second barrier layer 104b covers a portion of the conductive member 104c.

In some embodiments, the conductive member 104c is surrounded by a third barrier layer 104d. In some embodiments, the third barrier layer 104d is disposed between the conductive member 104c and the first dielectric layer 104a. In some embodiments, the third barrier layer 104d is disposed between the conductive member 104c and the second barrier layer 104b. In some embodiments, the third barrier layer 104d is configured to prevent diffusion from the conductive member 104c. In some embodiments, the third barrier layer 104d includes tantalum (Ta), tantalum nitride (TaN) or the like.

In some embodiments, a second dielectric layer 105 is disposed over the substrate 101, the first dielectric layer 104a and the conductive member 104c. In some embodiments, the second dielectric layer 105 is disposed over or contacted with the second barrier layer 104b. In some embodiments, the second dielectric layer 105 includes oxide, plasma enhanced oxide (PEOX), undoped silicate glass (USG) or the like.

In some embodiments, the capacitor 106 is disposed over the substrate 101, the ILD 102, the IMD 103, the conductive member 104c and the second dielectric layer 105. In some embodiments, the second dielectric layer 105 is contacted with at least a portion of the capacitor 106. In some embodiments, the capacitor 106 includes several metallic layers and several insulating layers. In some embodiments, the capacitor 106 is a metal-insulator-metal (MIM) capacitor. In some embodiments, the capacitor 106 is a high density metal-insulator-metal (HDMIM) capacitor.

In some embodiments, the capacitor 106 includes metallic layers (106a, 106c, 106e) and insulating layers (106b, 106d) disposed between the metallic layers (106a, 106c, 106e). In some embodiments, the metallic layers (106a, 106c, 106e) and the insulating layers (106b, 106d) are alternately disposed. In some embodiments, the metallic layers (106a, 106c, 106e) of the capacitor 106 includes titanium nitride (TiN) or the like. In some embodiments, the insulating layers (106b, 106d) includes zirconium dioxide ($ZrO_2$), aluminum oxide ($Al_2O_3$) or the like.

In some embodiments, the capacitor 106 includes a bottom metal 106a, a first insulator 106b, a middle metal 106c, a second insulator 106d and a top metal 106e. In some embodiments, the bottom metal 106a is disposed over or contacted with the second dielectric layer 105. In some embodiments, the bottom metal 106a is covered by the first insulator 106b. In some embodiments, the first insulator 106b is disposed over or contacted with the second dielectric layer 105.

In some embodiments, the middle metal 106c is disposed between the bottom metal 106a and the top metal 106e. In some embodiments, the middle metal 106c is covered by the second insulator 106d. In some embodiments, the middle metal 106c is disposed over the first insulator 106b and the bottom metal 106a. In some embodiments, the second insulator 160d is disposed over or contacted with the first insulator 106b. In some embodiments, the top metal 106e is disposed over the middle metal 106c and the bottom metal 106a. In some embodiments, the top metal 106e is disposed over or contacted with the second insulator 1067d.

In some embodiments, the third dielectric layer 107 is disposed over the substrate 101, the ILD 102, the IMD 104, the second dielectric layer 105 and the capacitor 106. In some embodiments, the third dielectric layer 107 is contacted with at least a portion of the capacitor 106. In some embodiments, the third dielectric layer 107 surrounds a portion of the capacitor 106. In some embodiments, the third dielectric layer 107 surrounds the top metal 106e of the capacitor 106.

In some embodiments, the third dielectric layer 107 includes several layers of dielectric material. In some embodiments, the third dielectric layer 107 includes an oxide layer 107a and a nitride layer 106b. In some embodiments, the oxide layer 107a and the nitride layer 107b are alternately disposed. In some embodiments, the oxide layer 107a surrounds a portion of the capacitor 106. In some embodiments, the oxide layer 107a surrounds the top metal 106e of the capacitor 106. In some embodiments, the nitride layer 106b surrounds a portion of the capacitor 106. In some embodiments, the nitride layer 107b surrounds the top metal 106e of the capacitor 106. In some embodiments, the oxide layer 107a or the nitride layer 107b is contacted with the capacitor 106. In some embodiments, the nitride layer 107b is disposed over the oxide layer 107a, or the oxide layer 107a is disposed over the nitride layer 107b.

In some embodiments, the oxide layer 107a includes plasma enhanced oxide (PEOX), undoped silicate glass (USG) or the like. In some embodiments, the nitride layer 107b includes silicon nitride (SiN) or the like. In some embodiments, a thickness of the third dielectric layer 107 is about 6000 angstrom (A) to about 10000 A. In some embodiments, a thickness of the oxide layer 107a is about 1000 A to about 2000 A. In some embodiments, a thickness of the nitride layer 107b is about 1000 A to about 2000 A.

In some embodiments, the conductive via 108 is extended through the third dielectric layer 107, the capacitor 106 and the second dielectric layer 105. In some embodiments, the conductive via 108 is extended through the oxide layer 107a and the nitride layer 107b of the third dielectric layer 107. In some embodiments, the conductive via 108 is substantially orthogonal to the third dielectric layer 107. In some embodiments, the conductive via 108 is substantially orthogonal to the oxide layer 107a and the nitride layer 107b. In some embodiments, the conductive via 108 is disposed over and contacted with the conductive member 104c. In some embodiments, the conductive via 108 is surrounded by the third dielectric layer 107 and at least a portion of the capacitor 106. In some embodiments, the conductive via 108 is surrounded by the oxide layer 107a and the nitride layer 107b of the third dielectric layer 107.

In some embodiments, the conductive via 108 is surrounded by the bottom metal 106a, the first insulator 106b, the middle metal 106c, the second insulator 106d or the top metal 106e. In some embodiments, the conductive via 108 is electrically connected with the capacitor 106. In some embodiments, a cross section of the conductive via 108 is in a circular or other suitable shape. In some embodiments, the conductive via 108 includes copper, gold, silver, aluminum or the like. In some embodiments, the conductive via 108 includes aluminum copper (AlCu) alloy.

In some embodiments, the conductive via 108 is surrounded by a fourth barrier layer 110. In some embodiments, the fourth barrier layer 110 is disposed between the conductive via 108 and the third dielectric layer 107. In some embodiments, the fourth barrier layer 110 is disposed between the conductive via 108 and the oxide layer 107a. In some embodiments, the fourth barrier layer 110 is disposed between the conductive via 108 and the nitride layer 107b. In some embodiments, the fourth barrier layer 110 is disposed between the conductive via 108 and the capacitor 106. In some embodiments, the fourth barrier layer 110 is disposed between the conductive via 108 and the second dielectric layer 105. In some embodiments, the fourth barrier layer 110 includes tantalum (Ta), tantalum nitride (TaN) or the like.

In some embodiments, the conductive pad 109 is disposed over and contacted with the conductive via 108. In some embodiments, the conductive pad 10p9 is electrically connected to the conductive member 104c through the conductive via 108. In some embodiments, the conductive pad 109 is disposed over the third dielectric layer 107. In some embodiments, the conductive pad 109 is disposed over the oxide layer 107a or the nitride layer 107b. In some embodiments, the conductive pad 109 is disposed over a portion of the fourth barrier layer 110.

In some embodiments, the fourth barrier layer 110 is disposed between the conductive pad 109 and the third dielectric layer 107. In some embodiments, the fourth barrier layer 110 is disposed between the conductive pad 109 and the oxide layer 107a. In some embodiments, the fourth barrier layer 110 is disposed between the conductive pad 109 and nitride layer 107b. In some embodiments, a cross section of the conductive pad 109 is in a circular or other suitable shape. In some embodiments, the conductive pad 109 includes copper, gold, silver, aluminum or the like. In some embodiments, the conductive pad 109 includes aluminum copper (AlCu) alloy.

In some embodiments, a fourth dielectric layer 111 is disposed over the third dielectric layer 107. In some embodiments, the fourth dielectric layer 111 surrounds the conductive pad 109. In some embodiments, the fourth dielectric layer 111 is disposed over the oxide layer 107a or nitride layer 107b. In some embodiments, the fourth dielectric layer 111 includes plasma enhanced oxide (PEOX) or undoped silicate glass (USG) or the like. In some embodiments, the fourth dielectric layer 111 includes a first recess 111a disposed over the conductive pad 109. In some embodiments, a portion of the conductive pad 109 is exposed by the first recess 111a.

In some embodiments, a fifth barrier layer 112 is disposed over the fourth dielectric layer 111. In some embodiments, the fifth barrier layer 112 includes silicon nitride (SiN) or the like. In some embodiments, the fifth barrier layer 112 includes a second recess 112a disposed over the conductive pad 109 and the first recess 111a. In some embodiments, a portion of the conductive pad 109 is exposed by the second recess 112a.

In some embodiments, the bump pad 113 is disposed over and contacted with the conductive pad 109. In some embodiments, the bump pad 113 is surrounded by the fourth dielectric layer 111 and the fifth barrier layer 112. In some embodiments, a portion of the bump pad 113 is in the first recess 111a and the second recess 112a. In some embodiments, the bump pad 113 is under bump metallization (UBM) pad. In some embodiments, the bump pad 113 includes gold, silver, copper, nickel, tungsten, aluminum, palladium and/or alloys thereof.

In some embodiments, a seed layer 114 is disposed over the bump pad 113. In some embodiments, the seed layer 114 is conformal to the bump pad 113. In some embodiments, the seed layer 114 is surrounded by the fourth dielectric layer 111 and the fifth barrier layer 112. In some embodiments, the seed layer 114 includes copper.

In some embodiments, the conductive bump 115 is disposed over and electrically connected with the bump pad 113. In some embodiments, the conductive bump 115 is disposed over and electrically connected to the conductive pad 109. In some embodiments, the conductive bump 115 is configured to electrically connect to a circuitry or a conductive structure. In some embodiments, the conductive bump 115 includes conductive material includes solder, copper, nickel, gold or the like. In some embodiments, the conductive bump 115 is a conductive pillar, a solder ball, microbump or the like. In some embodiments, the conductive bump 115 is in a spherical, hemispherical or cylindrical shape.

Figure 2:
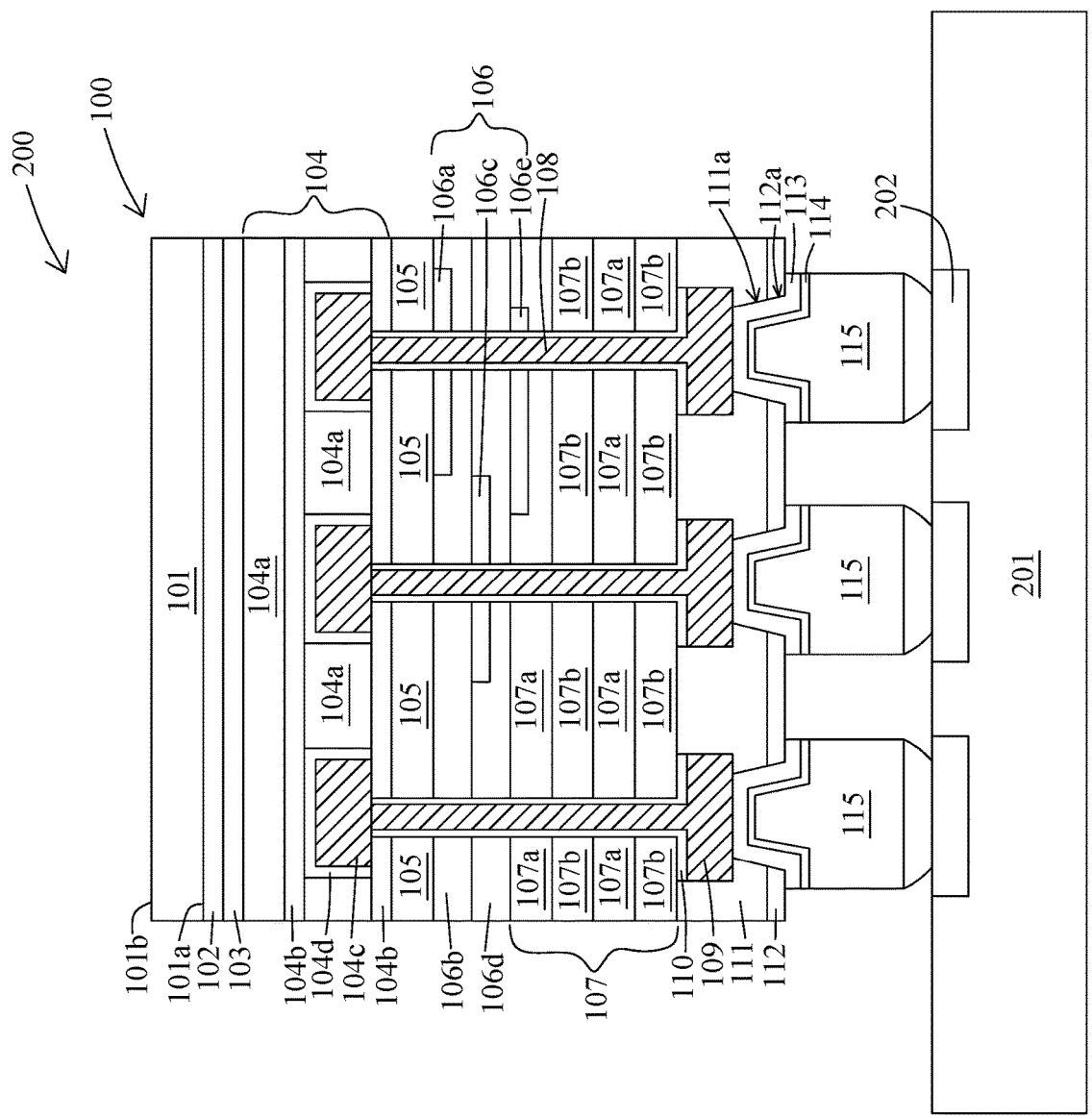
FIG. 2 is a schematic cross sectional view of a semiconductor structure in accordance with some embodiments of the present disclosure.

FIG. 2 is a schematic cross sectional view of a semiconductor structure 200 in accordance with various embodiments of the present disclosure. In some embodiments, the semiconductor structure 200 includes the semiconductor structure 100 of FIG. 1 as described above. In some embodiments, the semiconductor structure 200 includes a second substrate 201 and a second conductive pad 202 disposed over the second substrate 201.

In some embodiments, the second substrate 201 includes a circuitry or device disposed over the second substrate 201. In some embodiments, the second substrate 201 is a printed circuit board (PCB). In some embodiments, the semiconductor structure 100 is disposed over the second substrate 201. In some embodiments, the conductive bump 115 of the semiconductor structure 100 is mounted over the second substrate 201. In some embodiments, the conductive bump 115 is bonded with the second conductive pad 202. In some embodiments, a circuitry of the semiconductor structure 100 is electrically connected with a circuitry of the second substrate 201 by the conductive bump 115 and the conductive pad 202.

Figure 3:
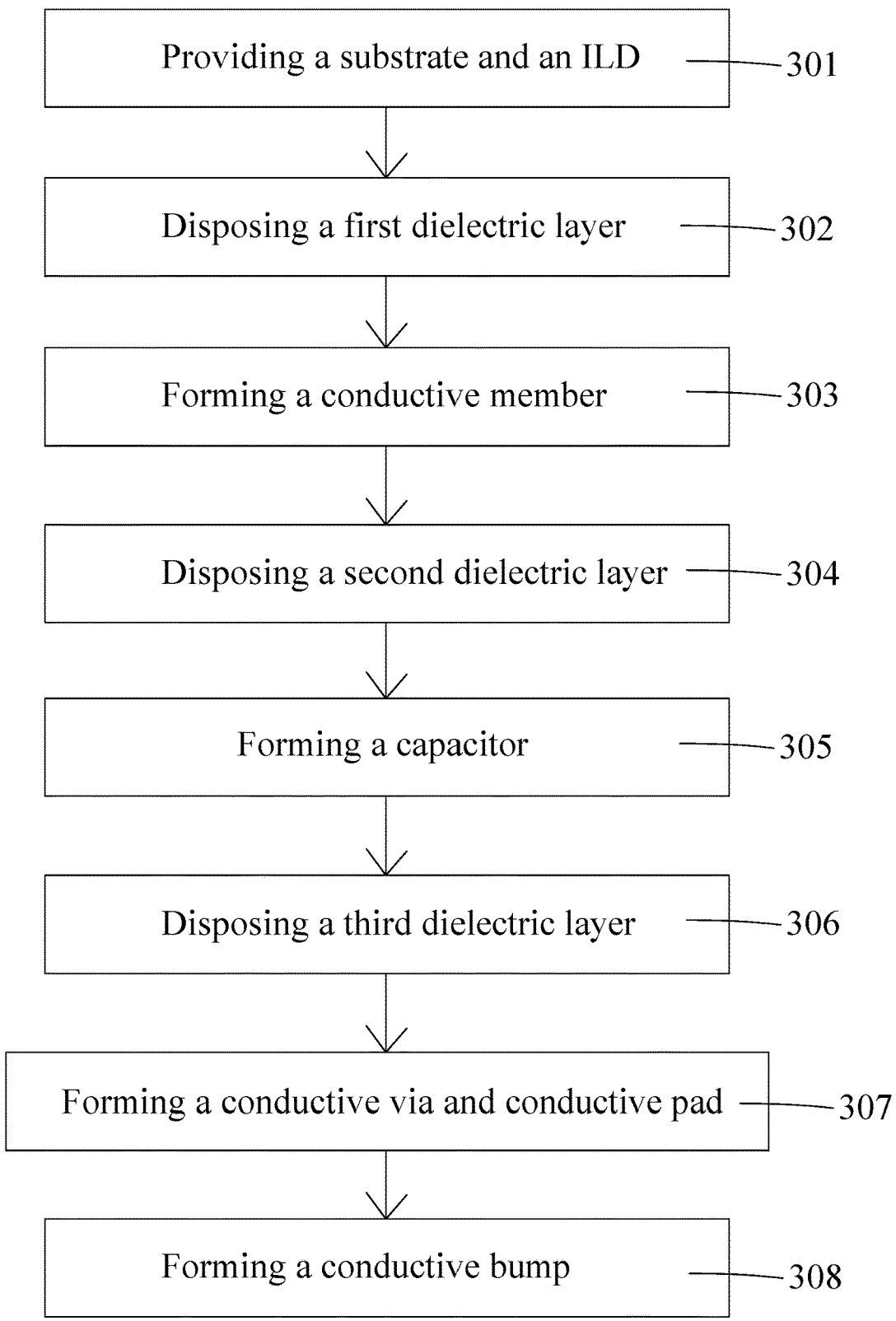
FIG. 3 is a flow diagram of a method of manufacturing a semiconductor structure in accordance with some embodiments of the present disclosure.

In the present disclosure, a method of manufacturing a semiconductor structure is also disclosed. In some embodiments, a semiconductor structure is formed by a method 300. The method 300 includes a number of operations and the description and illustration are not deemed as a limitation as the sequence of the operations. FIG. 3 is an embodiment of the method 300 of manufacturing a semiconductor structure. The method 300 includes a number of operations (301, 302, 303, 304, 305, 306, 307 and 308).

Figure 4:
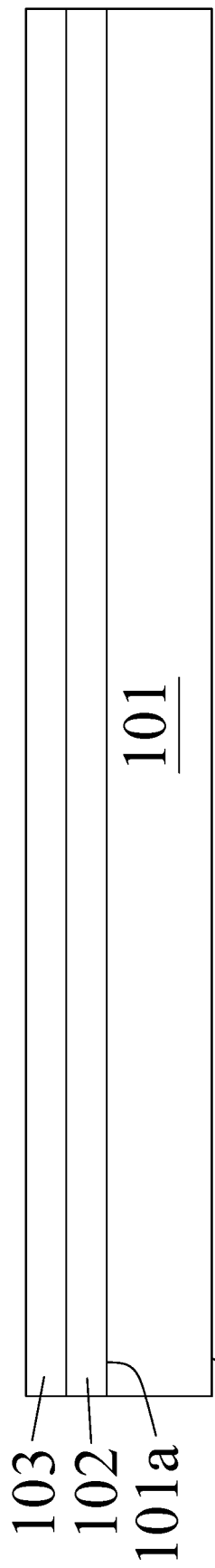

In operation 301, a substrate 101 and an ILD 102 over the substrate 101 are provided as shown in FIG. 4. In some embodiments, the substrate 101 includes silicon or the like. In some embodiments, the substrate 101 includes a first surface 101a and a second surface 101b opposite to the first surface 101a. In some embodiments, the ILD 102 is formed over the first surface 101a of the substrate 101. In some embodiments, the formation of the ILD 102 includes disposing a dielectric material such as silicon oxide, BPSG, phosphosilicate PSG or the like, and forming a semiconductor device such as transistor or the like in the dielectric material. In some embodiments, the dielectric material is disposed by chemical vapor deposition (CVD) or any other suitable operations.

In some embodiments, a first barrier layer 103 is formed over the ILD 102 as shown in FIG. 4. In some embodiments, the first barrier layer 103 includes silicon carbide (SiC) or the like. In some embodiments, the first barrier layer 103 is formed by CVD or any other suitable operations. In some embodiments, the substrate 101, the ILD 102 and the first barrier layer 103 have configurations as described above or shown in FIG. 1.

Figure 5:
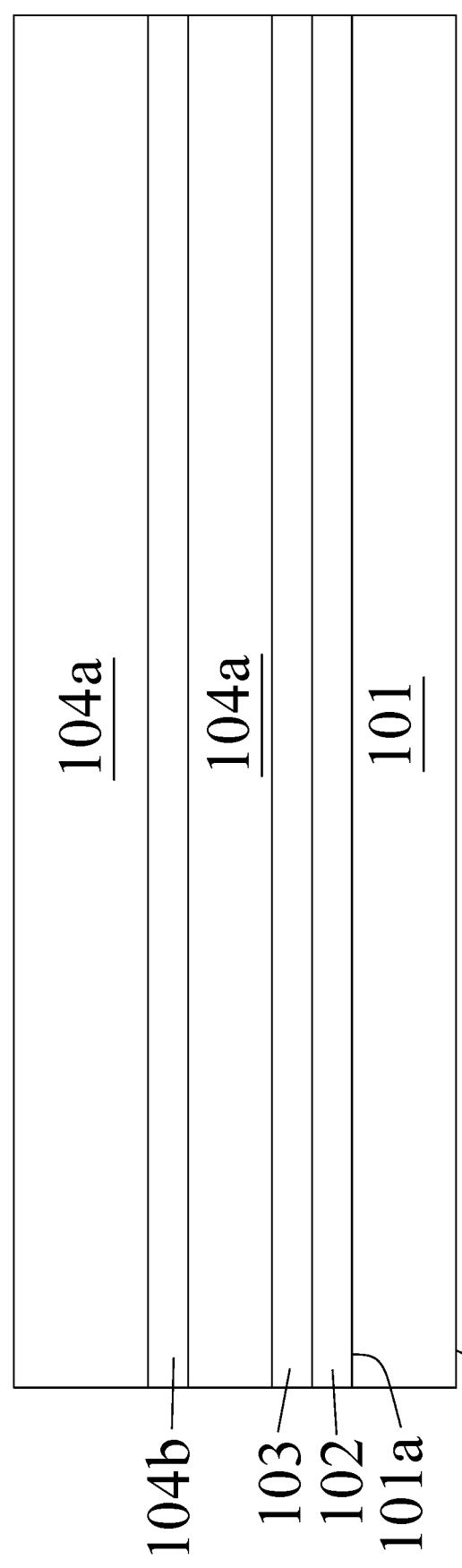

In operation 302, a first dielectric layer 104a is disposed over the substrate 101 and the ILD 102 as shown in FIG. 5. In some embodiments, the first dielectric layer 104a is formed by disposing several layers of dielectric material. In some embodiments, the first dielectric layer 104a includes USG or the like. In some embodiments, the first dielectric layer 104a is disposed by CVD or any other suitable operations.

In some embodiments, a second barrier layer 104b is disposed in the first dielectric layer 104a as shown in FIG. 5. In some embodiments, a layer of the first dielectric layer 104a is disposed, and then the second barrier layer 104b is disposed over the layer of the first dielectric layer 104a. In some embodiments, the second barrier layer 104b includes silicon nitride (SiN) or the like. In some embodiments, the second barrier layer 104b is disposed by CVD or any other suitable operations. In some embodiments, the first dielectric layer 104a and the second barrier layer 104b have configurations as described above or shown in FIG. 1.

In operation 303, a conductive member 104c is formed as shown in FIGS. 6-7. In some embodiments, the conductive member 104c is surrounded by the first dielectric layer 104a. In some embodiments, the conductive member 104c is formed by removing a portion of the first dielectric layer 104a to form a first opening 203 as shown in FIG. 6, disposing a conductive material such as copper or the like into the first opening 203 to form the conductive member 104c as shown in FIG. 7. In some embodiments, the removal of the first dielectric layer 104a includes photolithography, etching or any other suitable operations. In some embodiments, the conductive material is disposed by sputtering, electroplating or any other suitable operations.

In some embodiments, a third barrier layer 104d is disposed after the formation of the first opening 203 and before the disposing of the conductive material as shown in FIGS. 6-7. In some embodiments, the third barrier layer 104d includes tantalum (Ta), tantalum nitride (TaN) or the like. In some embodiments, the third barrier layer 104d is disposed by sputtering or any other suitable operations. In some embodiments, the second barrier layer 104b is disposed over the conductive member 104c, the third barrier layer 104d and the first dielectric layer 104a after the formation of the conductive member 104c and the third barrier layer 104d as shown in FIG. 7. In some embodiments, the second barrier layer 104b includes silicon nitride (SiN) or the like. In some embodiments, the second barrier layer 104b is disposed by CVD or any other suitable operations. In some embodiments, the conductive member 104c and the third barrier layer 104d have configurations as described above or shown in FIG. 1.

Figure 8:
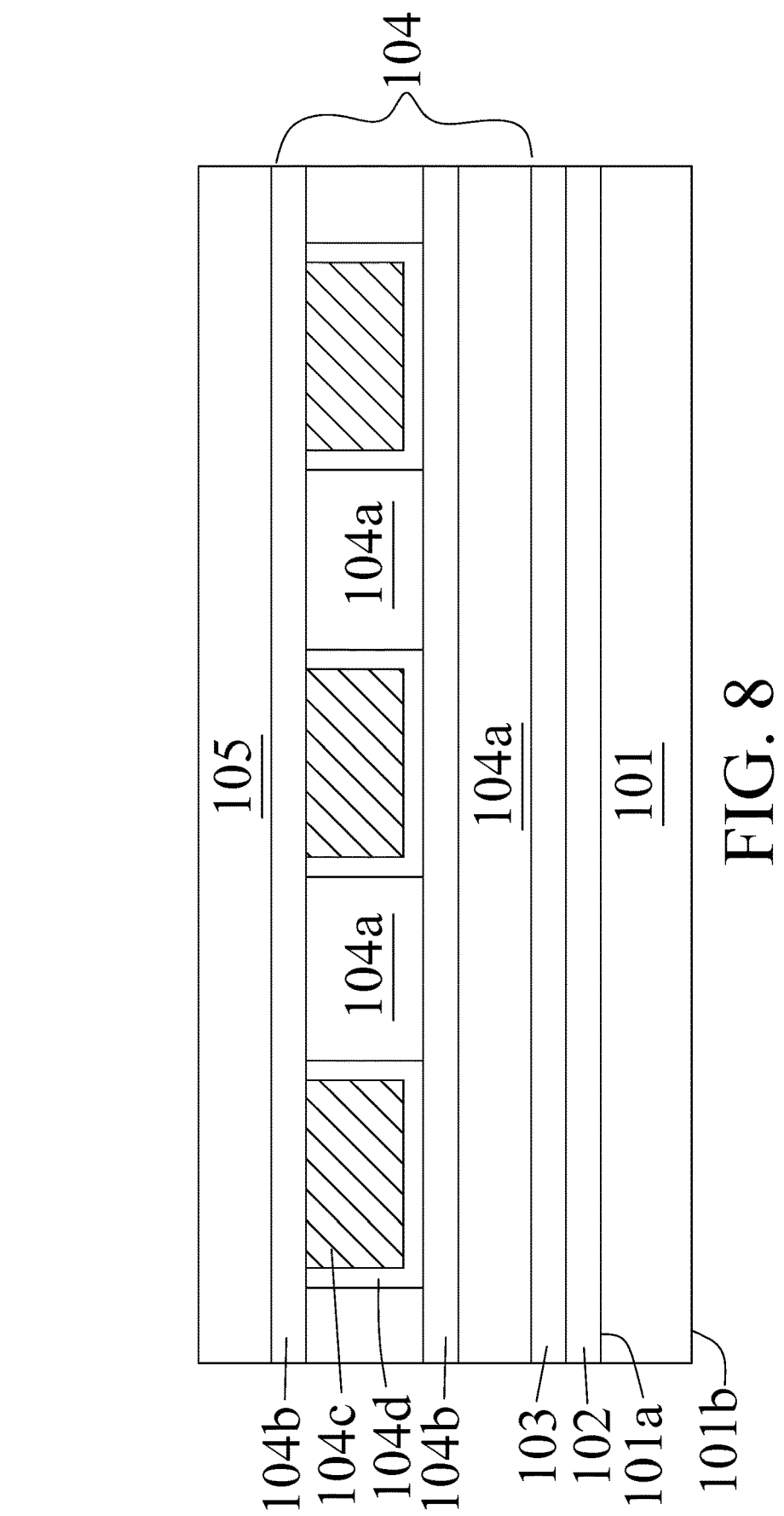

In operation 304, a second dielectric layer 105 is disposed over the first dielectric layer 104a and the conductive member 104c as shown in FIG. 8. In some embodiments, the second dielectric layer 105 is disposed over the second barrier layer 104b. In some embodiments, the second dielectric layer 105 includes PEOX, USG or the like. In some embodiments, the second dielectric layer 105 is disposed by CVD or any other suitable operations. In some embodiments, the second dielectric layer 105 has configurations as described above or shown in FIG. 1.

Figure 9:
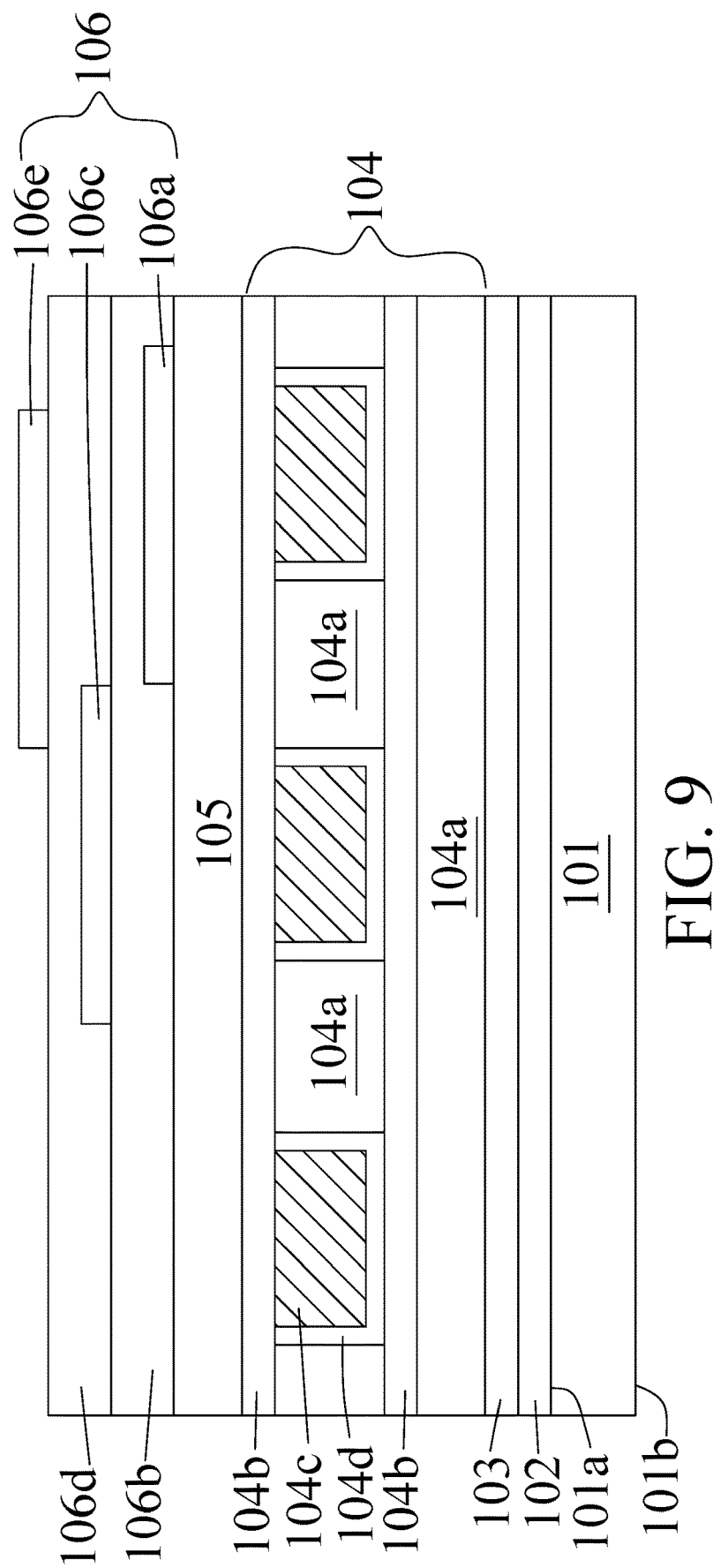

In operation 305, a capacitor 106 is formed over the second dielectric layer 105 as shown in FIG. 9. In some embodiments, the capacitor 106 is formed by alternately disposing metallic layers (106a, 106c, 106e) and insulating layers (106b, 106d). In some embodiments, the metallic layers (106a, 106c, 106e) are covered by the insulating layers (106b, 106d). In some embodiments, each of the metallic layers (106a, 106c, 106e) includes titanium nitride (TiN) or the like. In some embodiments, each of the insulating layers (106b, 106d) includes zirconium dioxide ($ZrO_2$), aluminum oxide ($Al_2O_3$) or the like.

In some embodiments, the metallic layers (106a, 106c, 106e) are formed by disposing a metallic material and removing some portions of the metallic material. In some embodiments, the disposing of the metallic material includes CVD or any other suitable operations. In some embodiments, the removal of some portions of the metallic material includes photolithography, etching or any other suitable operations. In some embodiments, the insulating layers (106b, 106d) are disposed by CVD or any other suitable operations. In some embodiments, the capacitor 106 has configurations as described above or shown in FIG. 1.

Figure 10:
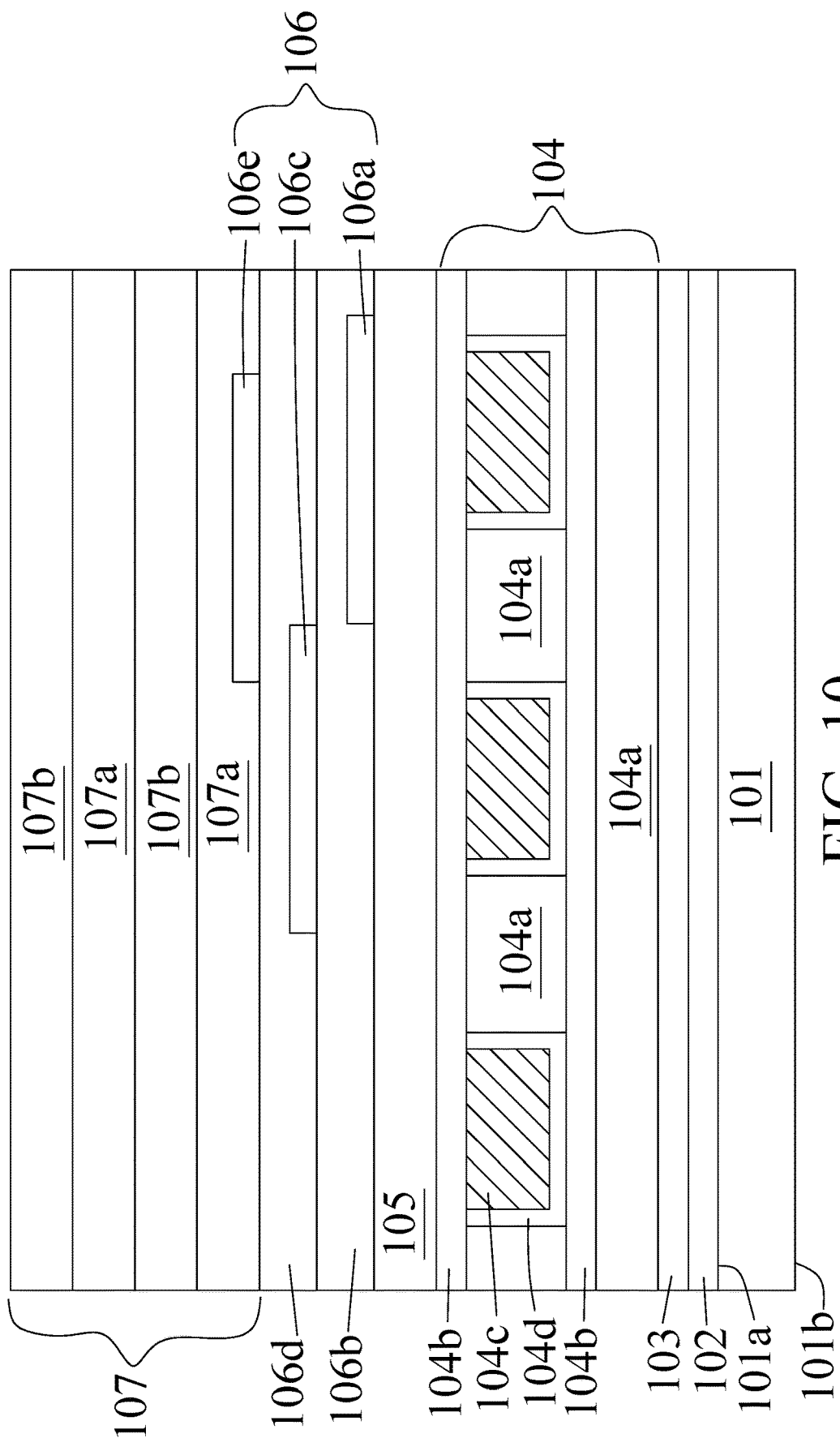

In operation 306, a third dielectric layer 107 is disposed over the capacitor 106 and the second dielectric layer 105 as shown in FIG. 10. In some embodiments, the third dielectric layer 107 is formed by disposing several layers of dielectric material. In some embodiments, the third dielectric layer 107 is formed by disposing an oxide layer 107a and disposing a nitride layer 107b. In some embodiments, the oxide layer 107a and the nitride layer 107b are disposed over the capacitor 106.

In some embodiments, the disposing of the oxide layer 107a is prior to the disposing of the nitride layer 107b. In some embodiments, the oxide layer 107a and the nitride layer 107b are alternately disposed. In some embodiments, the oxide layer 107a and the nitride layer 107b are disposed by CVD or any other suitable operations. In some embodiments, the oxide layer 107a includes PEOX, USG or the like. In some embodiments, the nitride layer 107b includes silicon nitride (SiN) or the like. In some embodiments, the third dielectric layer 107 has configurations as described above or shown in FIG. 1.

Figure 11:
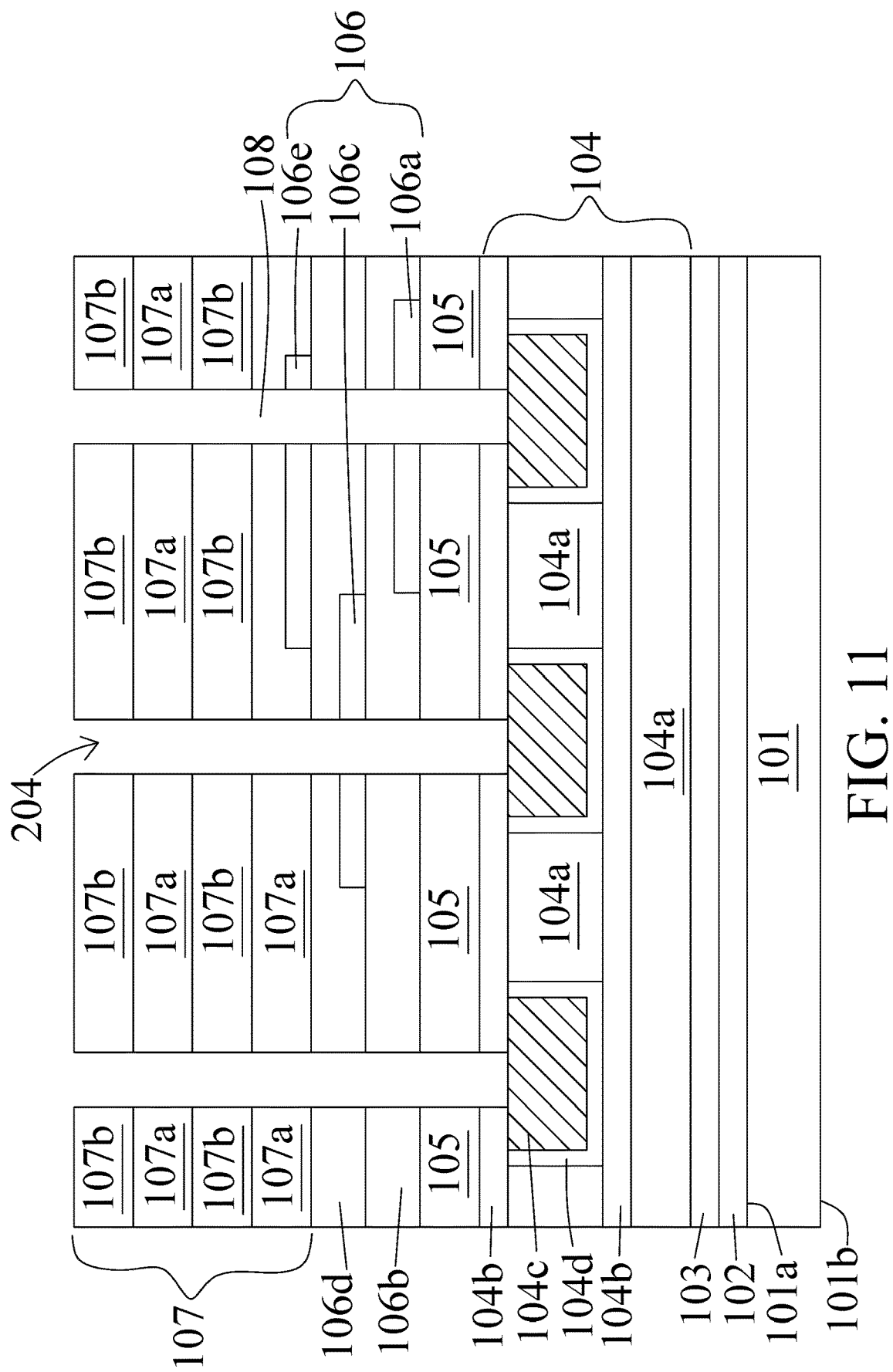
Figure 12:
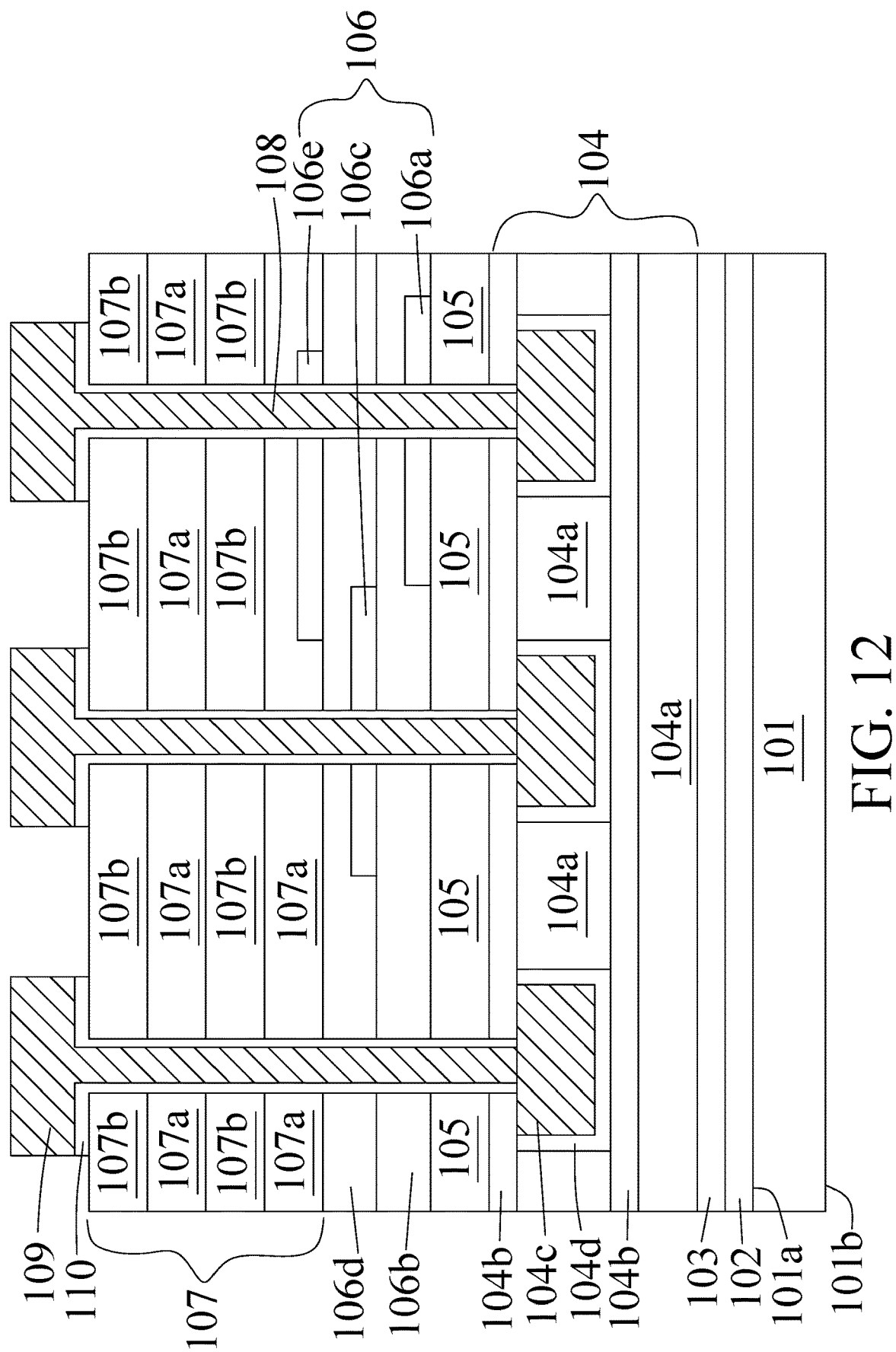

In operation 307, a conductive via 108 and a conductive pad 109 disposed over the conductive via 108 are formed as shown in FIGS. 11-12. In some embodiments, the conductive via 108 is coupled with the conductive pad 109. In some embodiments, the conductive via 108 is extended through the second dielectric layer 105, the capacitor 106 and the third dielectric layer 107. In some embodiments, the conductive via 108 is formed by removing portions of the second barrier layer 104b, the second dielectric layer 105, the capacitor 106 and the third dielectric layer 107 to form a second opening 204 as shown in FIG. 11, and then disposing a conductive material such as copper, silver, aluminum or the like into the second opening 204 as shown in FIG. 12.

In some embodiments, the second opening 204 is formed by removing portions of the oxide layer 107a and the nitride layer 107b. In some embodiments, the removal of the portions of the second barrier layer 104b, the second dielectric layer 105, the capacitor 106 and the third dielectric layer 107 includes photolithography, etching or any other suitable operations. In some embodiments, the disposing of the conductive material includes electroplating or any other suitable operations. In some embodiments, the conductive via 108 is surrounded by the oxide layer 107a, the nitride layer 107b and the capacitor 106.

In some embodiments, the conductive via 108 and the conductive pad 109 are formed by forming the second opening 204, disposing a fourth barrier layer 110 conformal to the second opening 204 and a surface of the third dielectric layer 107, disposing a conductive material over the fourth barrier layer 110, and removing portions of the fourth barrier layer 110 and the conductive material disposed over the third dielectric layer 107. In some embodiments, the fourth barrier layer 110 includes tantalum (Ta), tantalum nitride (TaN) or the like. In some embodiments, the fourth barrier layer 110 is disposed by sputtering or any other suitable operations. In some embodiments, the removal of the conductive material and the fourth barrier layer 110 includes photolithography, etching or any other suitable operations. In some embodiments, the conductive via 108 and the conductive pad 109 have configurations as described above or shown in FIG. 1.

Figure 13:
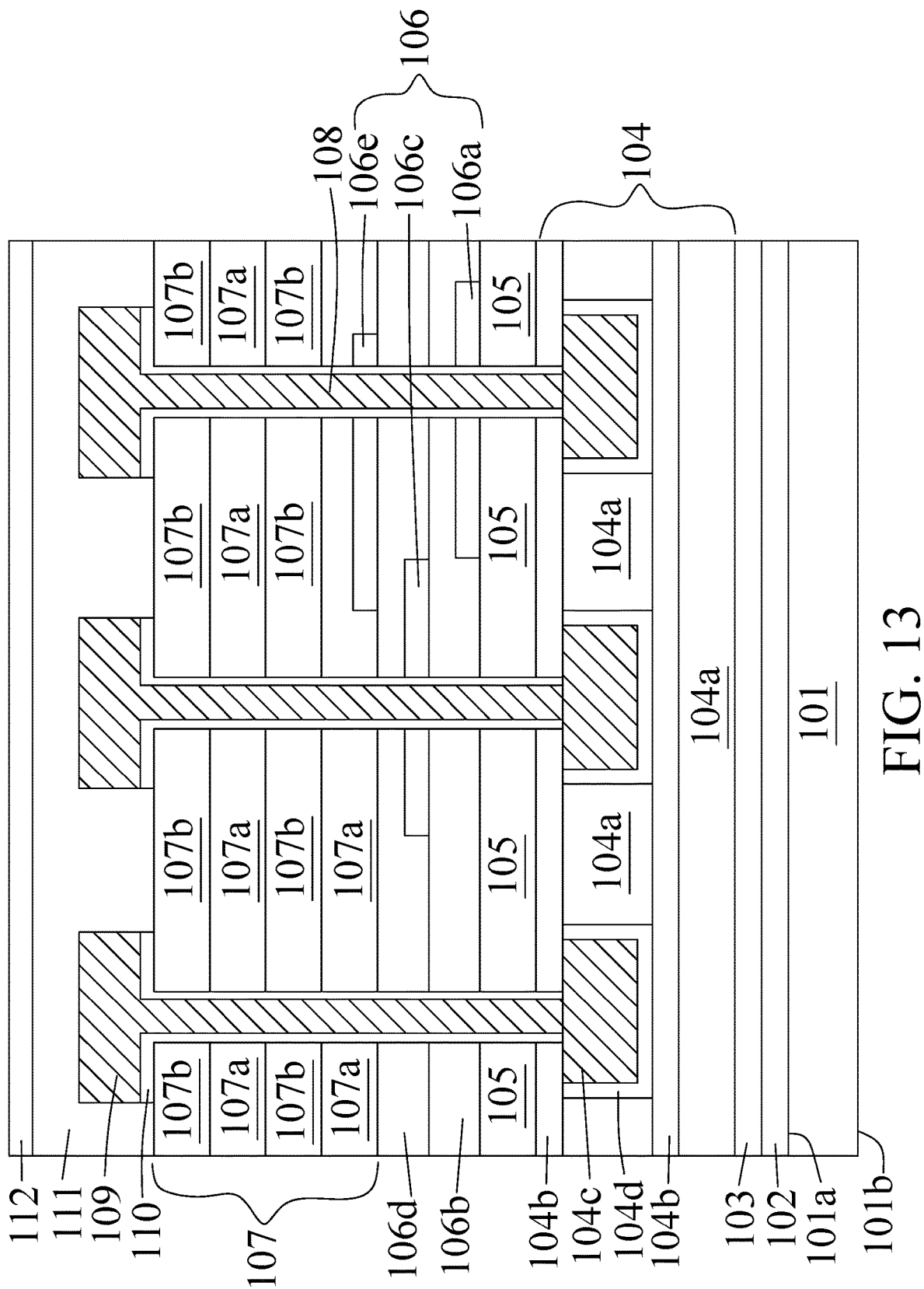
Figure 14:
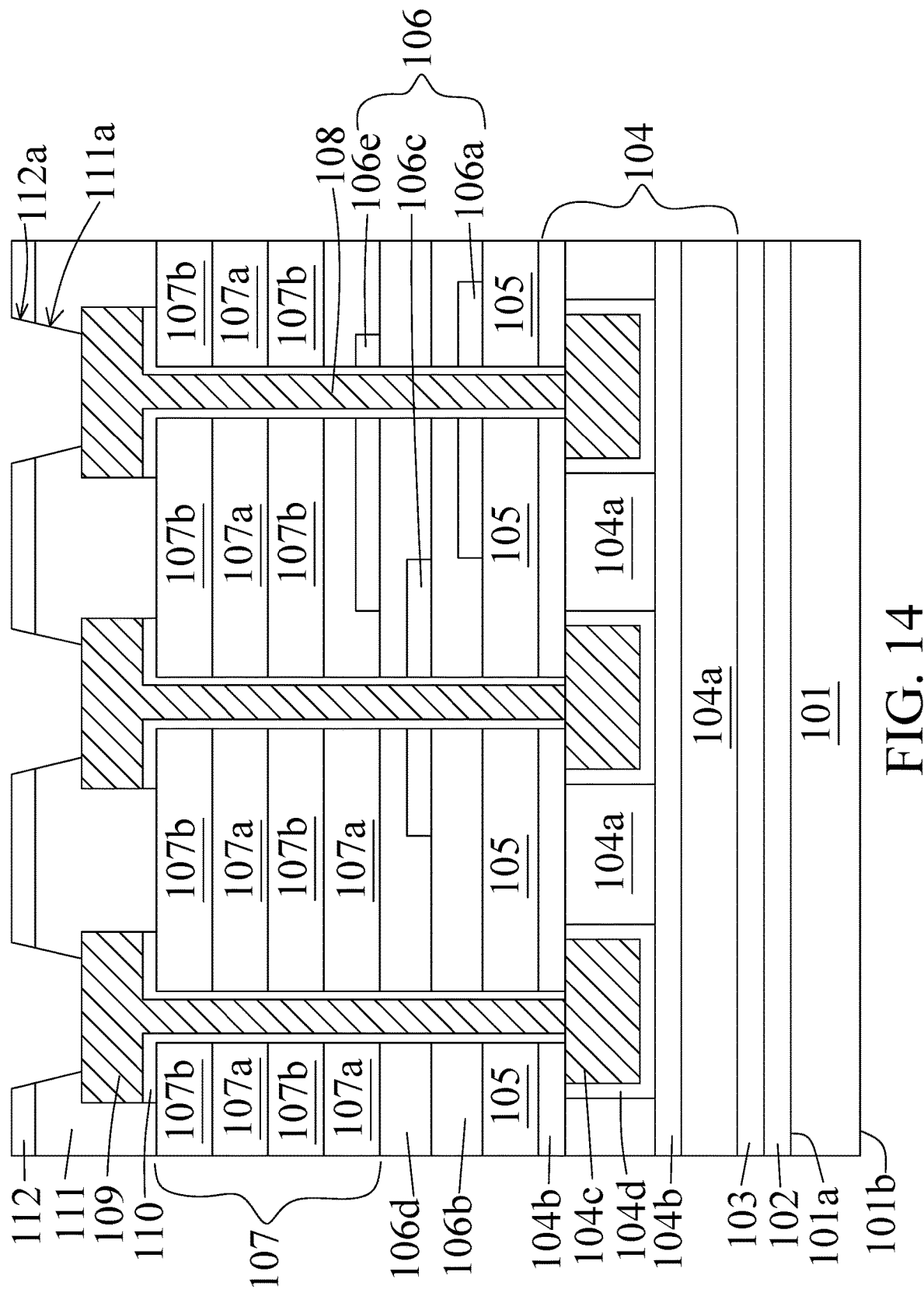
Figure 15:
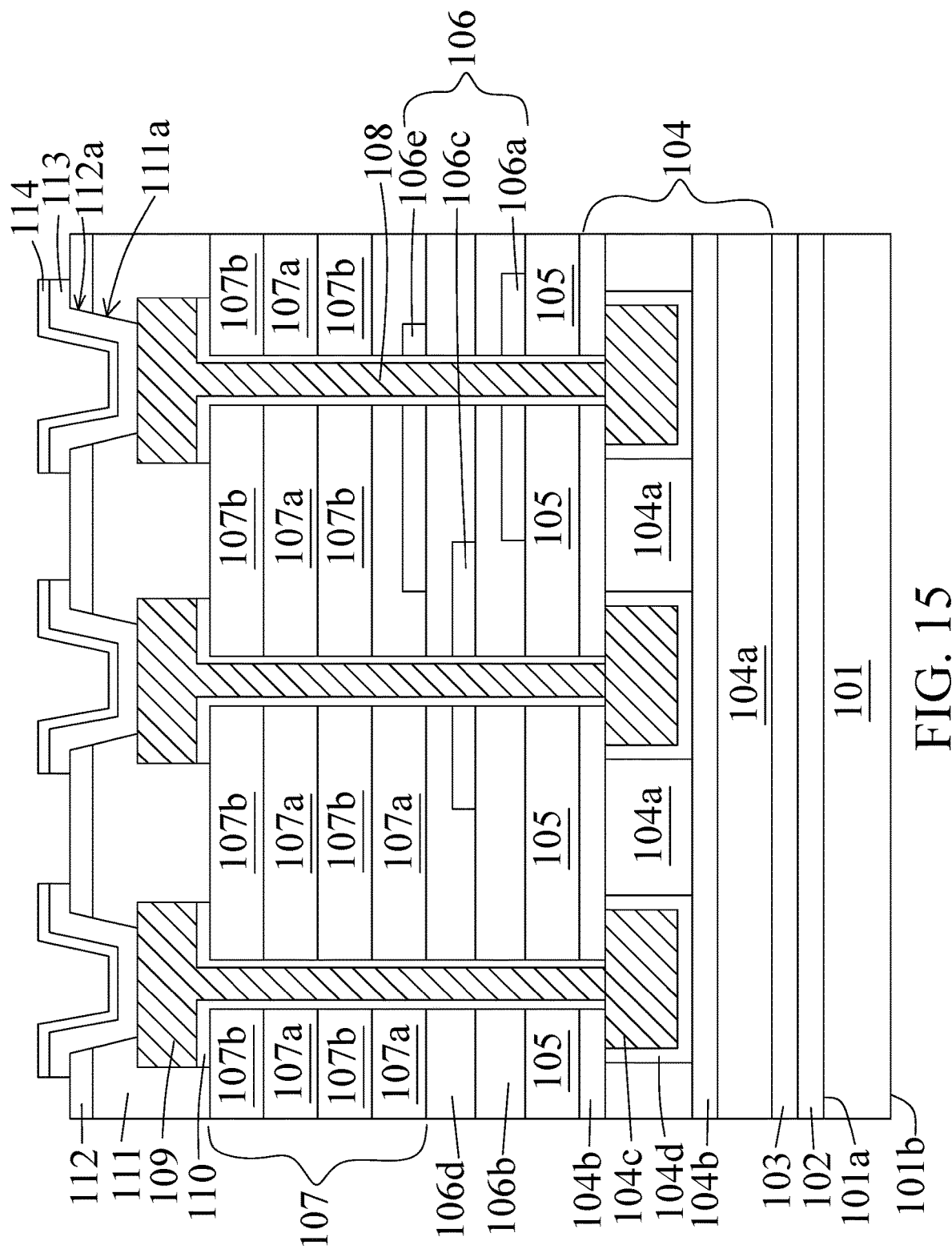

In some embodiments, a fourth dielectric layer 111, a fifth barrier layer 112, a bump pad 113 and a seed layer 114 are formed after the formation of the conductive via 108 and the conductive pad 109 (the operation 307) as shown in FIGS. 13-15. In some embodiments, the fourth dielectric layer 111 is disposed over the third dielectric layer 107 and the conductive pad 109. In some embodiments, the fourth dielectric layer 111 covers the conductive pad 109. In some embodiments, the fourth dielectric layer 111 includes PEOX, USG or the like. In some embodiments, the fourth dielectric layer 111 is disposed by CVD or any other suitable operations.

In some embodiments, the fifth barrier layer 112 is disposed after the disposing of the fourth dielectric layer 111. In some embodiments, the fifth barrier layer 112 includes silicon nitride (SiN). In some embodiments, the fifth barrier layer 112 is disposed by CVD or any other suitable operations. In some embodiments, portions of the fourth dielectric layer 111 and the fifth barrier layer 112 over the conductive pad 109 are removed to form the first recess 111a and the second recess 112a as shown in FIG. 14. In some embodiments, the first recess 111a and the second recess 112a are formed by photolithography, etching or any other suitable operations. In some embodiments, the conductive pad 109 is exposed by the first recess 111a and the second recess 112a.

In some embodiments, the bump pad 113 is disposed over the conductive pad 109. In some embodiments, the bump pad 113 is partially surrounded by the fourth dielectric layer 111 and the fifth barrier layer 112. In some embodiments, the bump pad 113 is disposed by sputtering, evaporation, electroplating or any other suitable operations. In some embodiments, the bump pad 113 is under bump metallization (UBM) pad. In some embodiments, the bump pad 113 includes gold, silver, copper, nickel, tungsten, aluminum, palladium and/or alloys thereof.

In some embodiments, the seed layer 114 is disposed conformal to the bump pad 113. In some embodiments, the seed layer 114 is configured to facilitate subsequent formation of a conductive bump 115. In some embodiments, the seed layer 114 includes copper. In some embodiments, the seed layer 114 is disposed by sputtering or any other suitable operations. In some embodiments, the fourth dielectric layer 111, the fifth barrier layer 112, the bump pad 113 and the seed layer 114 have configurations as described above or shown in FIG. 1.

Figure 16:
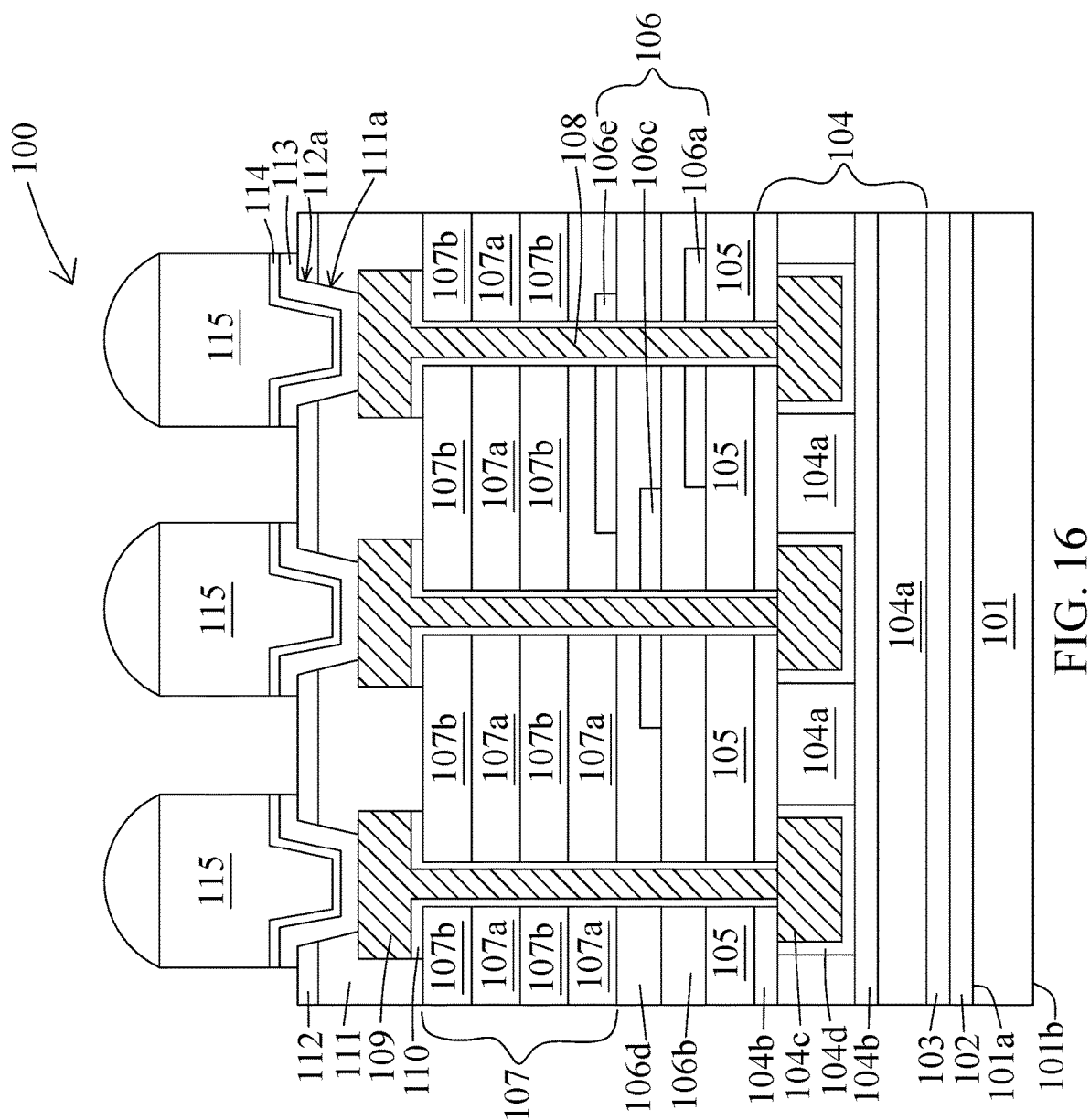

In operation 308, the conductive bump 115 is formed over the conductive pad 109 as shown in FIG. 16. In some embodiments, the conductive bump 115 is disposed over the seed layer 114. In some embodiments, the conductive bump 115 is electrically connected to the bump pad 113. In some embodiments, the conductive bump 115 is formed by lithography, electroplating, stencil printing or any other suitable operations. In some embodiments, the conductive bump 115 includes conductive material includes solder, copper, nickel, gold or the like. In some embodiments, the conductive bump 115 is a conductive pillar, a solder ball, microbump or the like. In some embodiments, the conductive bump 115 is in a spherical, hemispherical or cylindrical shape. In some embodiments, the conductive bump 115 has configurations as described above or shown in FIG. 16. In some embodiments, a semiconductor structure 100 as described above or shown in FIG. 1 is formed.

Figure 17:
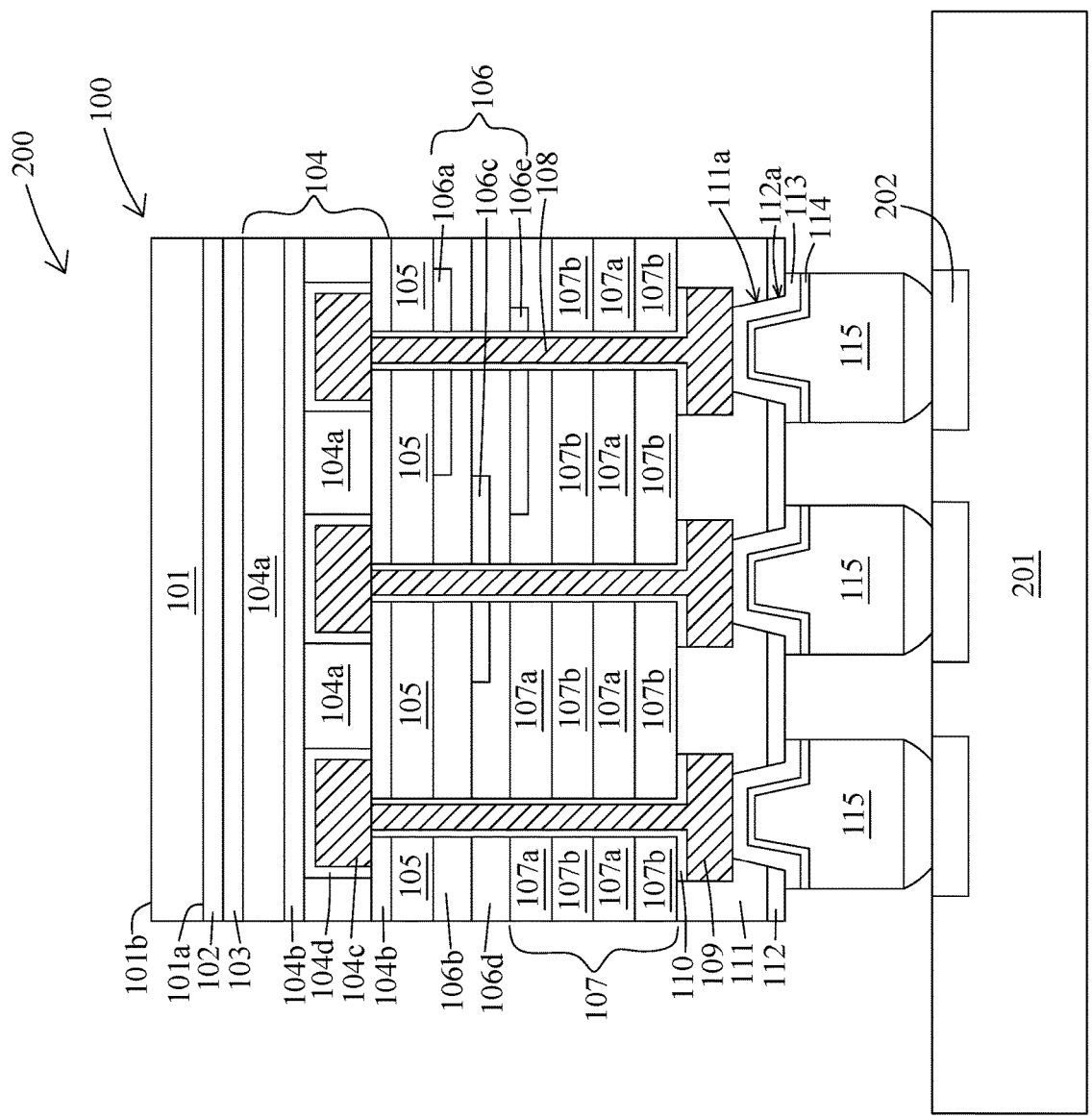

In some embodiments, the semiconductor structure 100 is mounted over a second substrate 201 as shown in FIG. 17. In some embodiments, the conductive bump 115 of the semiconductor structure 100 is disposed over and bonded with a second conductive pad 202 of the second substrate 201. In some embodiments, the semiconductor structure 100 is flipped and then bonded with the second substrate 201. In some embodiments, a circuitry of the semiconductor structure 100 is electrically connected with a circuitry of the second substrate 201 by the conductive bump 115 and the conductive pad 202. In some embodiments, the second substrate 201 and the second conductive pad 202 have configurations as described above or shown in FIG. 2.

In the present disclosure, a semiconductor structure is disclosed. The semiconductor structure includes a substrate, a capacitor disposed over the substrate, a dielectric layer over the capacitor, a conductive via extended through the capacitor and the dielectric layer, and a conductive bump disposed over the conductive via. The dielectric layer includes an oxide layer and a nitride layer. Since the dielectric layer includes the nitride layer, a strength of the dielectric layer is increased, and development of cracks and delamination of components of the semiconductor structure would be decreased or prevented.

In some embodiments, a semiconductor structure includes a substrate; a first dielectric layer disposed over the substrate; a conductive member surrounded by the first dielectric layer; a second dielectric layer disposed over the substrate, the first dielectric layer and the conductive member; a capacitor disposed over the conductive member and the second dielectric layer; a third dielectric layer disposed over the second dielectric layer and the capacitor; a conductive via disposed over and contacted with the conductive member, and extended through the second dielectric layer, the capacitor and the third dielectric layer; a conductive pad disposed over and contacted with the conductive via; a fourth dielectric layer disposed over the third dielectric layer and surrounding the conductive pad; and a conductive bump disposed over and electrically connected to the conductive pad, wherein the third dielectric layer includes an oxide layer and a nitride layer.

In some embodiments, the oxide layer and the nitride layer are disposed alternately. In some embodiments, the third dielectric layer is contacted with at least a portion of the capacitor. In some embodiments, the conductive via is surrounded by the third dielectric layer and at least a portion of the capacitor. In some embodiments, the oxide layer includes plasma enhanced oxide (PEOX) or undoped silicate glass (USG). In some embodiments, the nitride layer includes silicon nitride (SiN). In some embodiments, the capacitor includes a metallic layer and an insulating layer, and the metallic layer and the insulating layer are alternately disposed. In some embodiments, the capacitor is a metal-insulator-metal (MIM) capacitor.

In some embodiments, the second dielectric layer is contacted with at least a portion of the capacitor. In some embodiments, a barrier layer is disposed between the conductive via and the third dielectric layer. In some embodiments, the barrier layer is disposed between the conductive pad and the third dielectric layer. In some embodiments, the barrier layer is disposed between the conductive via and the second dielectric layer. In some embodiments, the semiconductor structure further includes an interlayer dielectric (ILD) disposed between the substrate and the first dielectric layer; a semiconductor device disposed in the ILD and electrically connected to the conductive member.

In some embodiments, a semiconductor structure includes a substrate; an interlayer dielectric (ILD) disposed over the substrate; an intermetal dielectric (IMD) disposed over the ILD; a conductive member surrounded by the IMD; a capacitor disposed over the IMD and the conductive member; an oxide layer disposed over the capacitor; a nitride layer disposed over the capacitor; a conductive via disposed over and contacted with the conductive member, and extended through the capacitor, the oxide layer and the nitride layer; a conductive pad disposed over and contacted with the conductive via; a bump pad disposed over and contacted with the conductive pad; and a conductive bump disposed over and electrically connected with the bump pad.

In some embodiments, the nitride layer is disposed over the oxide layer, or the oxide layer is disposed over the nitride layer. In some embodiments, the oxide layer or the nitride layer is contacted with the capacitor. In some embodiments, a barrier layer is disposed between the nitride layer and the conductive via and between the oxide layer and the conductive via.

In some embodiments, a method of manufacturing a semiconductor structure includes providing a substrate and an interlayer dielectric (ILD) over the substrate; disposing a first dielectric layer over the ILD and the substrate; forming a conductive member surrounded by the first dielectric layer; disposing a second dielectric layer over the first dielectric layer and the conductive member; forming a capacitor over the second dielectric layer; disposing a third dielectric layer over the capacitor and the second dielectric layer; forming a conductive via extended through the second dielectric layer, the capacitor and the third dielectric layer; forming a conductive pad over the conductive via; and forming a conductive bump over the conductive pad, wherein the disposing of the third dielectric layer includes disposing an oxide layer over the capacitor and disposing a nitride layer over the capacitor.

In some embodiments, the disposing of the oxide layer is prior to or after the disposing of the nitride layer. In some embodiments, the formation of the conductive via includes removing a portion of the oxide layer, a portion of the nitride layer and a portion of the capacitor to form an opening surrounded by the oxide layer, the nitride layer and the capacitor.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor structure, comprising:
a substrate;
a first dielectric layer disposed over the substrate;
a conductive member surrounded by the first dielectric layer;
a second dielectric layer disposed over the substrate, the first dielectric layer and the conductive member;
a capacitor disposed over the conductive member and the second dielectric layer;
a third dielectric layer disposed over the second dielectric layer and the capacitor;
a conductive via disposed over and contacted with the conductive member, and extended through the second dielectric layer, the capacitor and the third dielectric layer;
a conductive pad disposed over and contacted with the conductive via;

a fourth dielectric layer disposed over the third dielectric layer and surrounding the conductive pad; and a conductive bump disposed over and electrically connected to the conductive pad, wherein the third dielectric layer includes an oxide layer and a nitride layer.

2. The semiconductor structure of claim 1, wherein the oxide layer and the nitride layer are disposed alternately.

3. The semiconductor structure of claim 1, wherein the third dielectric layer is contacted with at least a portion of the capacitor.

4. The semiconductor structure of claim 1, wherein the conductive via is surrounded by the third dielectric layer and at least a portion of the capacitor.

5. The semiconductor structure of claim 1, wherein the oxide layer includes plasma enhanced oxide (PEOX) or undoped silicate glass (USG).

6. The semiconductor structure of claim 1, wherein the nitride layer includes silicon nitride (SiN).

7. The semiconductor structure of claim 1, wherein the capacitor includes a metallic layer and an insulating layer, and the metallic layer and the insulating layer are alternately disposed.

8. The semiconductor structure of claim 1, wherein the capacitor is a metal-insulator-metal (MIM) capacitor.

9. The semiconductor structure of claim 1, wherein the second dielectric layer is contacted with at least a portion of the capacitor.

10. The semiconductor structure of claim 1, wherein a barrier layer is disposed between the conductive via and the third dielectric layer.

11. The semiconductor structure of claim 10, wherein the barrier layer is disposed between the conductive pad and the third dielectric layer.

12. The semiconductor structure of claim 10, wherein the barrier layer is disposed between the conductive via and the second dielectric layer.

13. The semiconductor structure of claim 10, wherein the barrier layer contacts the oxide layer and the nitride layer.

14. The semiconductor structure of claim 1, further comprising:
an interlayer dielectric (ILD) disposed between the substrate and the first dielectric layer;
a semiconductor device disposed in the ILD and electrically connected to the conductive member.

15. A semiconductor structure, comprising:
a substrate;
an interlayer dielectric (ILD) disposed over the substrate;
an intermetal dielectric (IMD) disposed over the ILD;
a first conductive member and a second conductive member surrounded by the IMD;
a capacitor disposed over the IMD, the first conductive member and the second conductive member;
an oxide layer disposed over the capacitor;
a nitride layer disposed over the capacitor;
a first conductive via disposed over and contacted with the first conductive member, and extended through the capacitor, the oxide layer and the nitride layer; and
a second conductive via disposed over and contacted with the second conductive member, and extended through the capacitor, the oxide layer and the nitride layer,
wherein at least a portion of the capacitor is disposed between the first conductive via and the second conductive via.

16. The semiconductor structure of claim 15, wherein the nitride layer is disposed over the oxide layer, or the oxide layer is disposed over the nitride layer.

17. The semiconductor structure of claim 15, wherein the oxide layer or the nitride layer is contacted with the capacitor.

18. The semiconductor structure of claim 15, wherein a barrier layer is disposed between the nitride layer and the first conductive via and between the nitride layer and the second conductive via.

19. A semiconductor structure, comprising:
a substrate;
an interlayer dielectric (ILD) disposed over the substrate;
an intermetal dielectric (IMD) disposed over the ILD;
a conductive member surrounded by the IMD;
a capacitor disposed over the IMD and the conductive member;
a first oxide layer disposed over the capacitor;
a first nitride layer disposed over the first oxide layer;
a second oxide layer disposed over the first nitride layer;
a second nitride layer disposed over the second oxide layer;
a conductive via disposed over and contacted with the conductive member, and extended through the capacitor, the first oxide layer, the first nitride layer, the second oxide layer and the second nitride layer; and
a conductive pad disposed over and contacted with the conductive via,
wherein the conductive via extends between and couples with the conductive member and the conductive pad.

20. The semiconductor structure of claim 19, wherein the first oxide layer, the first nitride layer, the second oxide layer and the second nitride layer surround the conductive via.

* * * * *